United States Patent
Heyne et al.

(10) Patent No.: US 7,126,401 B2
(45) Date of Patent: Oct. 24, 2006

(54) INTEGRATABLE, CONTROLLABLE DELAY DEVICE, USE OF A DELAY DEVICE, AS WELL AS AN INTEGRATABLE MULTIPLEXER FOR USE IN A DELAY DEVICE

(75) Inventors: Patrick Heyne, München (DE); Musa Saglam, München (DE)

(73) Assignee: Infineon Technologies AG, Munich (DE)

( * ) Notice: Subject to any disclaimer, the term of this patent is extended or adjusted under 35 U.S.C. 154(b) by 32 days.

(21) Appl. No.: 11/077,374

(22) Filed: Mar. 11, 2005

(65) Prior Publication Data
US 2005/0218954 A1 Oct. 6, 2005

(30) Foreign Application Priority Data
Mar. 26, 2004 (DE) .................... 10 2004 014 927

(51) Int. Cl.
*H03H 11/26* (2006.01)
(52) U.S. Cl. ..................... 327/270; 327/271
(58) Field of Classification Search ........ 327/270–272, 327/274, 276–278, 280, 281, 284, 285, 149, 327/158, 161
See application file for complete search history.

(56) References Cited

U.S. PATENT DOCUMENTS 5,355,097 A * 10/1994 Scott et al. ................. 331/1 A
6,094,103 A * 7/2000 Jeong et al. .................. 331/57
6,737,901 B1 5/2004 Hein et al. .................. 327/270

* cited by examiner

*Primary Examiner*—Linh My Nguyen
(74) *Attorney, Agent, or Firm*—Edell, Shapiro & Finnan, LLC

(57) ABSTRACT

A delay device has series-connected multiplexers in a differential form. First connections of the multiplexers are connected to the output of an upstream multiplexer. Second inputs of the multiplexers are connected to the input connection to which the signal to be delayed can be supplied. A control signal controls the switch setting of one of the multiplexers such that its output is connected to the input of the delay device. The other multiplexers have the other switch setting. In consequence, a specific delay time is set for the delay device. The multiplexers have four current paths which are coupled in pairs. One of the current path pairs can be decoupled from the current source via a transistor.

35 Claims, 3 Drawing Sheets

INTEGRATABLE, CONTROLLABLE DELAY DEVICE, USE OF A DELAY DEVICE, AS WELL AS AN INTEGRATABLE MULTIPLEXER FOR USE IN A DELAY DEVICE

This application claims priority under 35 U.S.C. §§119 and/or 365 to DE Application No. 102004014927.5, filed on Mar. 26, 2004, the entire contents of which are hereby incorporated by reference.

FIELD OF THE INVENTION

The invention relates to an integratable, controllable delay device having an input connection for an input signal to be delayed, having an output connection for a delayed output signal, and having a control connection for a control signal which controls the delay time. The delay device contains series-connected multiplexers which themselves have first, second, third, and fourth current paths, which each contain a first and a second switch. On the reference ground potential side, the current paths are coupled to a current source, and on the supply potential side, the current pats are coupled to resistance elements.

The invention also relates to use of an integratable controllable delay device such as in a delay locked loop. Finally, the invention relates to an integratable multiplexer which can be used in a delay device such as this.

BACKGROUND

Such integratable, controllable delay devices are widely used for delaying a clock signal in integrated semiconductor circuits. One particular use of the delay device is in a delay locked loop. Delay locked loops are used to produce clock signals with a predetermined phase angle in digitally processing circuits. For example, in synchronously operated integrated semiconductor memories which operate on the double data rate principle, i.e., DDR SDRAMs (Double Data Rate Synchronous Dynamic Random Access Memories), a delay locked loop (DLL) is used in order to account for internal signal delay times in production, on the output side, of a clock signal, with the data to be emitted being produced in synchronism with an input clock signal supplied at a different point in the integrated circuit.

A delay locked loop compares the clock signal which is supplied to the input side of the delay unit with the delayed clock signal that is produced on the output side, and readjusts the delay as a function of the phase difference until the phase difference is as close to zero as possible. It is particularly important for the clock on the output side to be as stable and free of jitter as possible. For example, the clock on the output side should be influenced as little as possible by fluctuations in the supply voltage and its current delay time setting shall be independent of the drive of the delay unit.

SUMMARY

Typical data rates for double data rate SDRAMs are 500 MHz. Delay locked loops which do not lose the delay value setting in the standby or power saving mode are frequently designed using a two-stage concept. The delay path has a fine delay unit and a coarse delay unit connected downstream from it. This results in a wide operating range, as required for a long delay at low frequencies, and in high resolution at the same time, which requires a small step width. The delay device according to the present invention is intended to be capable of use, in particular, for the coarse delay unit in a delay path such as this in a DLL for a DDR SDRAM module.

Coarse delay units are subject to the requirements that the adjustable delay must be as short as possible even at high operating frequencies. A coarse delay step may be in the order of magnitude of 150 ps (Pico seconds). This delay should be as independent as possible of the manufacturing technology for the integrated circuit, for example, CMOS technology. Conventional delay paths have jitter, for example, which is evident in the form of small time fluctuations in the clock edges of the output signal. The selected delay time should be achieved as independently as possible of fluctuations in the supply voltage.

One known delay device, which can be used in a delay locked loop for DDR SDRAMs, is described in German Patent Application DE-A-101 49 585. This delay device is preferably used as a coarse delay device, which is connected downstream from a fine delay device, in a delay locked loop. It already satisfies a large number of the requirements mentioned above for as little jitter as possible and for high supply voltage stability. At the same time, the multiplexers in the delay device can still be optimized, thus improving the voltage stability, the phase jitter and the influence of parameter fluctuations of the components in an integrated implementation, in the sense of optimization of the circuit.

One object of the invention is to specify an integratable controllable delay device which has a delay time which can be set as exactly as possible, thus allowing a much more stable, jitter-free output clock to be produced when used in a delay locked loop. In particular, the output clock should be as independent as possible of manufacture-dependent fluctuations in the parameters of the components, fluctuations in the supply voltage, or temperature fluctuations.

According to the invention, this object is achieved by an integratable, controllable delay device as claimed in the features of patent claim 1.

An integratable, controllable delay device according to the invention comprises: an input connection for an input signal to be delayed, an output connection for a delayed output signal and a control connection for a control signal which controls the delay time and has two or more bits; two or more multiplexers each having a first and a second input connection and an output connection, with the multiplexers being connected in series by the second connection of a downstream multiplexer being connected to the output of an upstream multiplexer and by the first connections of all of the multiplexers being coupled to the input connection, with one of the multiplexers being coupled to the output connection, with at least one of the two or more multiplexers having: a first, a second, a third and a fourth current path which respectively contain a first switch which is connected to one of the inputs of the multiplexer, and a respective second switch which is connected to a line, which is associated with one bit of the control signal, of a control connection, with the current paths being coupled on the one hand to a resistance element, and the first and the second current path being connected to a current source, and the third and the fourth current path being connected via a further switch to the current source, with the further switch and the second switches in the third and in the fourth current path being controllable in the same sense.

One use of a delay device such as this is specified in patent claim 18.

According to the invention, an integratable, controllable delay device is used in a delay locked loop in which the delay time of the delay device is readjusted as a function of any phase difference between a clock signal which can be supplied to the delay device and a signal which can be tapped off on the output side.

Finally, patent claim 19 specifies an integratable multiplexer which can be used in a delay device as mentioned above.

An integratable multiplexer such as this for use in a delay device comprises: a first and a second input, an output and a control connection; a first, a second, a third and a fourth current path which contain a respective first switch which is connected to one of the inputs of the multiplexer, and in each case one second switch which is connected to the control connection, with the current paths being coupled on the one hand to a resistance element, and the first and the second current path being connected to a current source, and the third and the fourth current path being connected via a further switch to the current source, with respective control connections of the further switch and of the second switches in the third and in the fourth current path being connected to one another.

Multiplexers are provided in the delay device according to the invention in order to form the signal delay time which acts on the signal to be delayed. All the multiplexers are connected with one of their inputs and one output in series. The other input of the multiplexers is jointly coupled to a node and is connected to the connection which produces the input signal to be delayed.

Depending on the required delay time, the input signal to be delayed is input into the series circuit at one of the multiplexers. A different delay time is produced, corresponding to the number of effective multiplex stages that the signal has to pass through before the output. The output signal is tapped off at the output of the last multiplexer connected in this series circuit. One of the inputs of the first multiplexer in the series circuit is connected to a constant potential, preferably ground.

Designing the delay device with multiplexers means that the respective capacitive load to be driven on the output side of the multiplexers and the load on the output of the last multiplexer stage remain unchanged irrespective of the delay time that is in each case selected. The variation that is formed as a function of the selected delay time is applied to the input side of the multiplexers. Capacitive fluctuations resulting from this in the capacitive load on the input side can thus be compensated for by means of a suitably powerful driver producing the input clock signal to be delayed. The signal to be delayed and which is supplied to the delay unit is thus not subject to any capacitive load fluctuation depending on the controllably selected delay time. The driver which produces the input signal to be delayed may be a conventional inverter. The output of in each case one of the multiplexers is connected only to the input of a single further downstream multiplexer.

The delay unit is preferably designed to process differential signals. This means that a complementary, inverted signal is processed at the same time as each signal. This compensates for the influence of supply voltage fluctuations on the delay time. Each of the multiplexers has a particularly advantageous circuitry refinement which is suitable for processing differential signals. When using this delay unit in a delay locked loop, this results in a relatively jitter-free output clock signal even in different operating conditions.

Each of the multiplexers expediently has four current paths, which are connected at one end to a current source and are coupled via this to a first pole of the supply voltage, for example ground. The other ends of the four current paths are coupled in pairs to respective resistance elements. The signals are input into the four current paths differentially. The resistance elements are preferably field-effect (MOS) transistors connected as diodes, preferably MOS diodes. The diodes are connected to the second pole of the supply voltage. In consequence, the current paths are also largely decoupled from the second pole of the supply voltage. It is even more advantageous for the diode to be connected in parallel with a field-effect (MOS) transistor connected as a current source. This transistor is driven with a constant potential at its control connection. The parallel circuit formed from the MOS diode and MOS current source may be regarded as an active resistance or linearized transistor.

In detail, the current paths each contain two field-effect transistors connected with their controlled paths in series. One of the switches in the first and in the second current path is in each case jointly controlled by a line of the control signal which selects the delay time. The comparable transistors in the third and in the fourth current path are jointly connected by the complementary signal component of this part of the control signal. The other transistors in the first and in the second current path are connected to the complementary signal outputs of a multiplexer which was previously connected in the chain of the delay elements. The other transistors in the third and in the fourth current path are driven by the complementary signal parts of the input signal, that is to say from the common input connection. Those ends of the current paths which are connected to the active resistance are connected to one another, crossed over. The first and the third current path are connected to one active resistance, and the second and the fourth current path are connected to the other active resistance.

Depending on the delay time to be selected, one of the multiplexers is set such that its output is connected to its first of the two input connections. At this point, the clock signal to be delayed is fed into the chain of series-connected multiplexers. All of the other multiplexers, both the upstream multiplexers and the downstream multiplexers, are set such that their output produces a signal connection to their respective second input.

According to the invention, two of the current paths, namely the third and the fourth current path, are advantageously connected to the current source on the reference ground potential side via a further switch, which may be an n-channel field-effect transistor. This further switch is driven by one bit of the control signal. The control signal is in this case the same as that which also controls the respective second switches in the third and in the fourth current paths. This means that, when the third and fourth current paths are switched off in any case, the third and fourth current paths are decoupled from the current source on the reference ground potential side. Any voltage variations which are input via the gate-source capacitance from the complementary input-side clock signals are thus decoupled from the current source, and hence also from the first and the second current path. It should be noted that only one of the multiplexers within the delay chain is driven such that the third and the fourth current path are conductive, while all of the other multiplexers are controlled such that the respective first and second current paths are conductive. The decoupling of the currently inactive third and fourth current paths from the corresponding active first and second current paths for the respective multiplexer thus results in the case of the multiplexers which assume this switch position in the potential of the coupling node of the first and of the second current paths not being influenced by the input clock signal, and thus remaining as constant as possible. The jitter in the output signal from the delay chain is thus reduced.

The synchronicity of the transistors during integrated production can be improved by advantageous design of the transistor surface areas of the transistors for the second switches. In the case of transistor pairs which are driven by differential signals, this synchronicity is important in order to avoid asymmetries in the output signal from the multiplexer and from the overall delay chain. Asymmetries such as these would lead to a shift in the duty cycle. A compensated duty cycle, which is as exactly symmetrical as possible, is important, however, in order to achieve adequate timing windows within the functional units that are driven by the DLL. According to the invention, the second switch transistors in the first and in the second current paths have larger transistor surface areas than the corresponding transistors in the third and in the fourth current paths of each multiplexer. Transistors having a larger transistor surface area have better synchronicity in terms of their electrical parameters during production as an integrated circuit, that is to say they are better matched. Since the second switch transistors in the third and in the fourth current paths in a delay chain are switched on only once, good matching of the second switch transistors in the first and in the second current paths is sufficient to achieve a particularly symmetrical duty cycle for the delayed output signal. The second switch transistors in the third and in the fourth current paths may be designed as normal, with a transistor surface area that is as small as possible.

In order to achieve better synchronicity by increasing the transistor surface area, the channel width of the second switch transistors in the first and in the second current paths is expediently chosen to be greater than the channel width of the second switch transistors in the third and in the fourth current paths. The channel length may remain the same.

The gate electrodes of the second switch transistors in the third and in the fourth current paths are coupled to the input connection. Since the transistor surface areas of these transistors are largely the same and are designed to be as small as technologically sensible, the input capacitance of the delay chain is not increased even though an improvement on the output-side duty cycle is nevertheless achieved. The driver capability of the driver which drives the input signal can thus remain small.

The coupling node for the first and for the second current paths as well as the source connection of the further switch transistor which is connected to the coupling node in the third and the fourth current paths is now connected only via the current source to the reference ground potential, which may be ground. The current source is, for example, in the form of a current source field-effect transistor operated in saturation. In particular, there is no need for any capacitance connected in parallel with the current source. This avoids the inputting of any potential fluctuations form the line on the reference ground potential side. Such fluctuations in the reference ground potential can thus no longer influence the jitter.

Finally, positive feedback capacitors are provided on the supply potential side in order to keep the jitter in the output clock signal as small as possible. At least one of the output connections, or both of the output connections, is or are therefore connected to the positive supply voltage pole via a respective capacitance. Fluctuations at this supply voltage pole are thus coupled directly to the output line. These capacitances are connected in parallel with the active resistance elements. These active resistance elements are field-effect transistors connected as diodes. The positive feedback ensures that largely the same voltage is dropped across the diodes and that the current through the diodes thus remains largely constant independently of any voltage fluctuations at the positive supply voltage pole.

Finally, the reference voltages that are used are connected via blocking capacitors to one of the supply potentials. For example, the reference voltage which drives a transistor (which is driven by this) in the load element of the multiplexer is coupled to the positive pole of the supply voltage via a capacitor. The gate connection of the current source transistor is, on the other hand, connected to the reference ground potential connection via an appropriate capacitor. Fluctuations on the respective supply line are thus blocked by the correspondingly driven transistors in the resistance element and the current source on the reference ground potential side, which is in the form of a current source transistor.

BRIEF DESCRIPTION OF THE FIGURES.

The invention will be explained in detail in the following text with reference to the exemplary embodiment which is illustrated in the drawing. Corresponding elements in the various figures are provided with the same reference symbols. In the figures.

DETAILED DESCRIPTION

Figure 1:
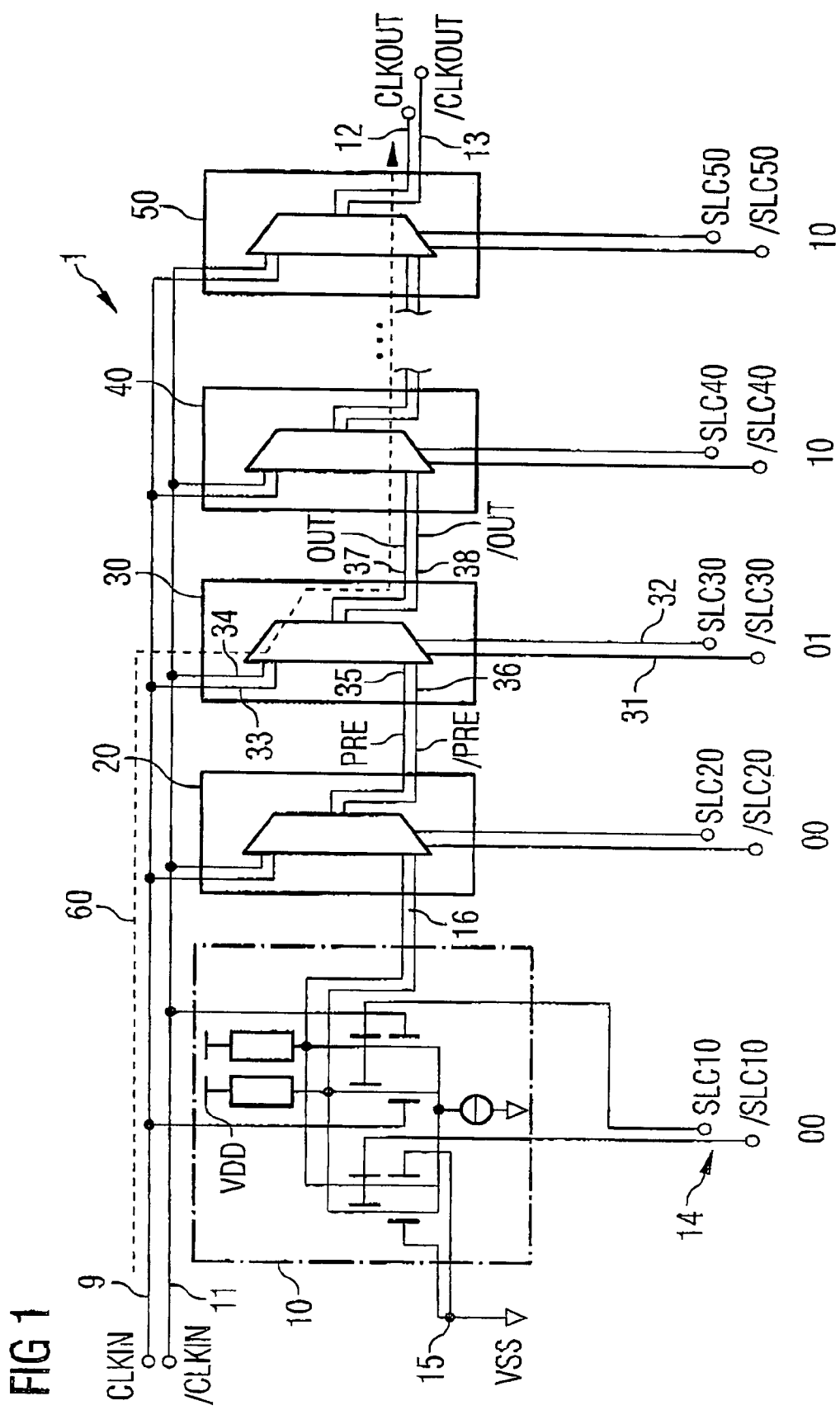
FIG. 1 shows a block diagram of a delay unit.
Figure 3:
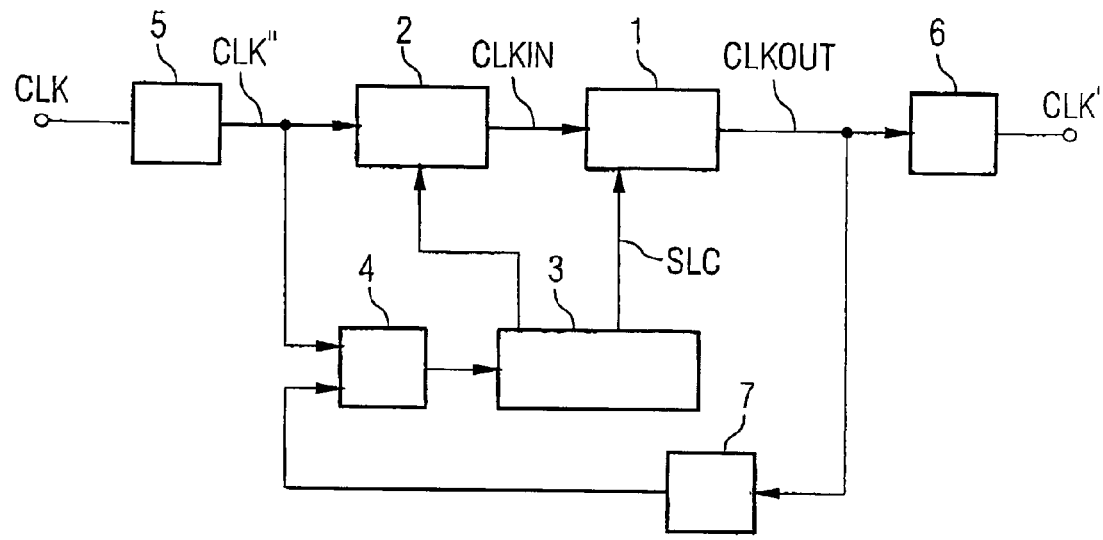
FIG. 3 shows a block diagram of a delay locked loop.

The circuit in FIG. 1 has a delay unit 1, which can advantageously be used in the delay locked loop illustrated in FIG. 3. The input clock signal CLKIN is thus supplied as a differential signal with complementary signal components CLKIN and /CLKIN. The delay unit 1 is supplied at inputs 9, 11 with an input clock signal CLKIN to be delayed, and with the input clock signal /CLKIN that is complementary to this. On the output side, a delayed output clock signal, which is once again in differential form, with an in-phase component CLKOUT and an antiphase component /CLKOUT can be tapped off at the connections 12, 13. The delay time between the input clock signal and the output clock signal is controlled as a function of a signal SLC. The signal SLC has a large number of bits, SLC10, SLC20, etc., which themselves once again each have a normal component and a component which is complementary to it, and are supplied at a connection 14 which comprises a large number of lines. All of the signal processing in the delay unit 1 is thus carried out in a differential form. The voltage range of the inputs and outputs of the delay stage 10 is limited. The signals SLC, /SLC are full-level signals, and are thus quasi-static.

The delay unit has a large number of series-connected multiplexers, of which the multiplexers 10, 20, 30, 40, 50 are illustrated, for example. All of the multiplexers are internally the same. For example, the multiplexer 30 will also be explained in detail in conjunction with the detailed embodiment shown in FIG. 2. A first signal input 33, 34, which in each case carry differential signals, of the multiplexer 30 is (in the same way as all the other comparable inputs of the other multiplexers) coupled to the connections 9, 11 for supplying the differential input signal CLKIN, /CLKIN. The second differential input 35, 36 of the multiplexer is connected to the differential output of the upstream multiplexer 20. The differential outputs 37, 38 are connected in a corresponding manner to the second input of the downstream multiplexer 40. The corresponding bit of the control signal SLC30, /SLC30 is supplied in a differential form to the differential control connections 31, 32.

The output of the last multiplexer 50 arranged in the series circuit is connected to the outputs 12, 13 of the delay unit 1. The second input of the first multiplexer 10 arranged in the series circuit of the multiplexers is connected to ground potential VSS.

The magnitude of the delay time between the differential inputs 9, 11 and the differential outputs 12, 13 for the differential input clock signal CLKIN, /CLKIN that is supplied is governed by the number of multiplexers which the clock signal passes through between the input and output of the delay unit 1. In the illustrated situation, the input clock signal CLKIN, /CLKIN is supplied to the multiplexer 30 and passes through all of the downstream multiplexers 40, 50. The signal path is indicated by a dashed line, and is annotated 60. For this purpose, all of the multiplexers upstream of the multiplexer 30, i.e., the multiplexers 10, 20, are set such that the signal path which is selected in the respective multiplexer connects the respective output to the second input, i.e., the input which is illustrated at the bottom in the drawing. The downstream multiplexers 40, 50 have the same switch position, so that they pass on the signal supplied to them at the second input, i.e., the bottom input in the illustration, to their output. Only the multiplexer 30 has a different setting for its signal path. In its case, the outputs 37, 38 are connected to the first differential input 33, 34. The input clock signal, CLKIN is thus supplied to the multiplexer 30 at the first input, and passes through all of the downstream multiplexers 40, 50 in order to reach the differential output 12, 13, as is shown by the signal path 60, indicated by a dashed line, in FIG. 1.

In the described circuit, the input 9, 11 is always loaded with the same capacitive load, largely independently of the switching state. Any capacitance variations which nevertheless exist can be compensated for by means of an appropriately large driver driving the input 9, 11. The output 12, 13 likewise provides the same driver power for downstream circuits.

The switch setting of the respective multiplexers is defined by corresponding bits in the control signal SLC. The respective bits are supplied to the multiplexers as mutually complementary signals.

Figure 2:
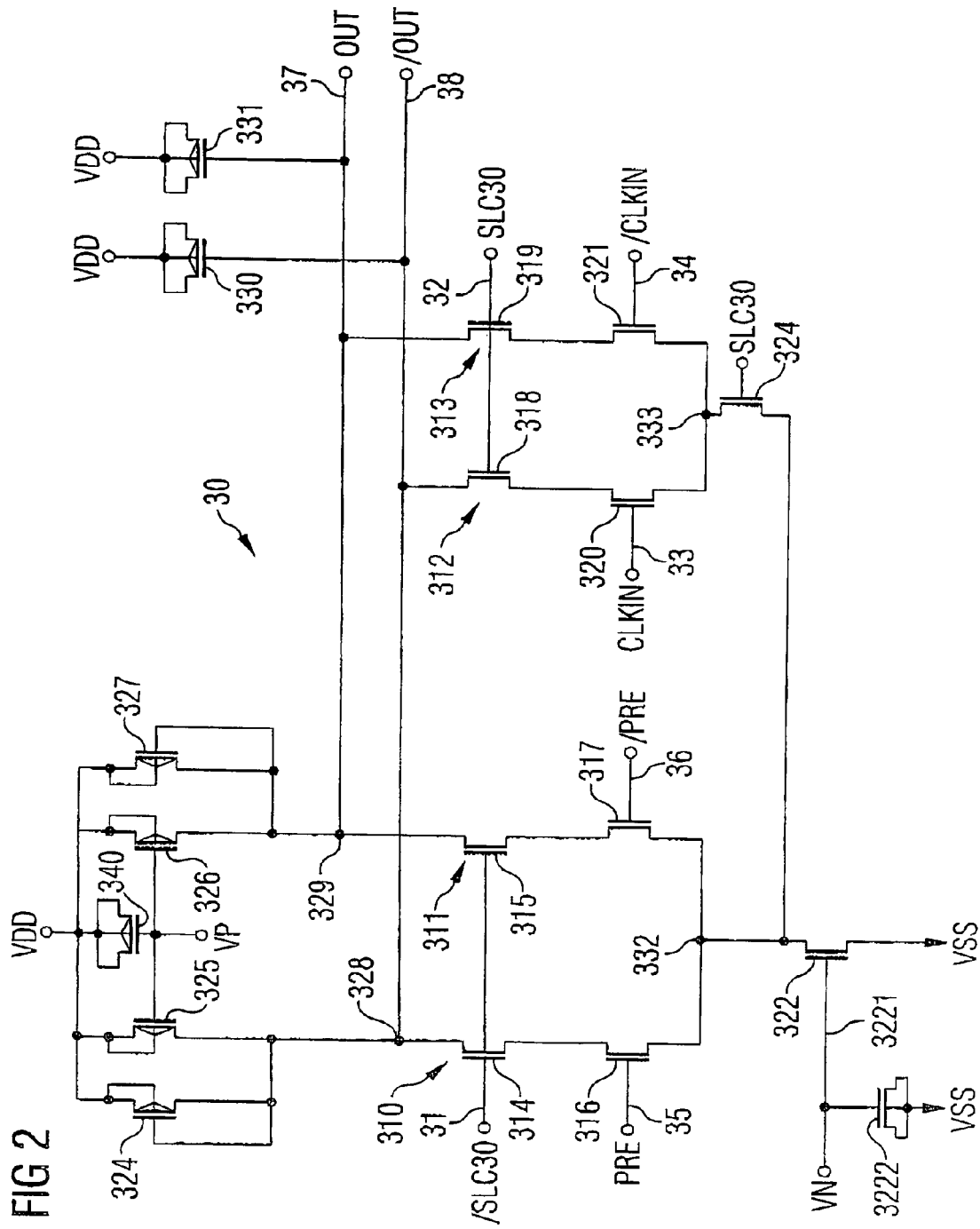
FIG. 2 shows a detailed circuit diagram at the transistor level of a multiplexer which is used in the delay device shown in FIG. 1.

All of the multiplexers 10, . . . , 50 are designed as illustrated in detail in FIG. 2. A multiplexer such as this may also in principle be used in its own right for other purposes. However, it is advantageously used in the delay chain illustrated in FIG. 1, and in turn within the delay locked loop illustrated in FIG. 3. The multiplexer 30 illustrated, for example, in FIG. 2 has four current paths 310, 311, 312, 313. These are jointly coupled to a current source 322 at the end of the current paths on the ground side, that is to say the reference ground potential side. The current paths 310, 311 are coupled to the node 332, and are directly connected to the current source 322. The current paths 312, 313 are coupled to the node 333. The node 333 is coupled to the current source 322 via the drain/source path through a switch transistor 324. The switch 324, which is preferably in the form of an n-channel field-effect transistor, is controlled on the gate side by the bit SLC30 in the control signal SLC which sets the delay time. The gate connection of the transistor 324 is thus controlled in the same sense as the gate connections of the transistors 318, 319. This means that, when the transistors 318, 319 are switched off and the current from the current source 322 is flowing through the current paths 310, 311, the transistor 324 is likewise switched off. The node 333 is then decoupled from the current source 322. The clock signal, which is supplied to the gate connections of the transistors 320, 321 all the time and modulates its gate/source capacitance as a function of the clock signal, is kept away from the current source 322. The potential at the node 332 thus remains largely constant when the current paths 312, 313 are switched off, and is not influenced by any modulation from the input-side clock signal CLKIN, /CLKIN. Neither the transistors 316, 317 nor the current paths 310, 311 result in any clock-signal modulation of the currents. The timing jitter on the output signal, OUT, /OUT is thus improved by the provision of the transistor 324.

The source connection of the transistor 324 and the node 332 are directly connected to the current source 322, and are connected to the connection for the reference ground potential VSS only via the current source 322. No provision is made for any separate capacitance which, for example, could connect the node 332 and the source connection of the transistor 324 to the reference ground potential VSS. Fluctuations in the supply network of the ground potential VSS, which are caused by switching processes in other functional units in the integrated semiconductor circuit, can thus not be fed to the source connections of the transistors 316, 317, 320, 321 and thus cannot change the conductivity behavior of these transistors. Even if these effects may be low, fluctuations in the supply potential VSS are decoupled from the transistors 316, 317, 320, 321 by the current source 322, and are kept away from them. The potential at the node 332 is thus not influenced by fluctuations in the potential VSS. The output signal OUT, /OUT thus has virtually no jitter produced by ground potential fluctuations.

The active resistance, which connects the node 328 to the supply potential VDD, has a p-channel field-effect transistor 325 connected as a current source. The gate connection of the transistor 325 is connected to a constant potential VP. A transistor 324 connected as an MOS diode is connected in parallel with the drain/source path through the transistor 325. The gate connection of the transistor 324 is connected to the node 328, in order to form the MOS diode function. The active resistance which is connected to the node 329 is formed by corresponding circuitry by the p-channel field-effect transistors 326, 327, whose parameters can be controlled better during production than resistances. The active resistances result in the potential difference between 328, 329 being as independent as possible of fluctuations in the supply voltage VDD, VSS. In principle, the active resistances could also be replaced by resistances.

In order furthermore to stabilize the currents through the current paths 310, 311, 312, 313, capacitances are provided which result in positive feedback from the circuit nodes to the respective ground and supply potentials VSS and VDD, respectively. The current through the current source 322 is thus stabilized by a blocking capacitor 3222. The capacitor 3222 is connected between the gate connection 3221 of the current source field-effect transistor which forms the current source 322, and the connection for the ground potential VSS. In the event of any fluctuation in the ground potential VSS, this fluctuation is passed on virtually unchanged to the gate connection 3221 of the current source transistor. In other words, the capacitor 3222 stabilizes the gate/source voltage of the current source field-effect transistor of the current source 322 even in the event of fluctuations in the ground potential VSS. Corresponding fluctuations in the ground potential are blocked by the gate connection 3221. The current produced by the current source 322 is thus stabilized.

The capacitor 3222 is, for example, an n-channel field-effect transistor, whose gate connection is connected to the gate connection 3221 of the current source transistor, and whose mutually coupled drain and source connections are coupled to the connection for the ground potential VSS. The gate/source/drain capacitance of this transistor has a capacitive effect.

The potential VP is stabilized with respect to the positive pole VDD of the supply voltage in a corresponding manner. The gate connection of the transistors 325, 326, which are supplied from the potential VP, is connected to the pole VDD of the supply voltage via a p-channel field-effect transistor 340 connected as a capacitor. The potential VP is produced from a separate voltage generator. Fluctuations in the potential VDD are passed on directly to the gate connections of the transistors 325, 326. The conductivity state of these transistors thus remains the same even in the event of fluctuations of the potential VDD. The current flowing through the transistors 325, 326 is largely independent of fluctuations in the positive supply voltage potential VDD. The capacitor 340 is a p-channel field-effect transistor, whose drain and source electrodes are coupled to one another. The gate connection is connected to the gate connections of the transistors 325, 326. The mutually coupled drain and source connections of the transistor 340 are connected to the pole VDD of the supply voltage. The gate/source/drain capacitance of this transistor is effective.

The load-side ends of the current paths 310, 311, 312, 313, that is to say the output connections 37, 38, are themselves connected via a respective capacitor 331, 330 to the positive pole VDD of the supply voltage. The capacitors 330, 331 are once again p-channel field-effect transistors. These stabilize the voltage between the nodes 329, 328 and the pole VDD of the supply voltage, so that fluctuations in the supply potential VDD are passed on with positive feedback to the nodes 328, 329. This results in the voltage along the drain/source paths of the transistors 324, 327 remaining constant irrespective of fluctuations in the supply potential VDD. The transistors 324, 327 are thus connected as so-called MOS diodes, so that the constancy of the voltage dropped across them results in the current flowing through them likewise remaining constant. Thus, overall, the capacitors 330, 331, 340 result in the current being carried at the circuit nodes 328, 329 for the supply potential VDD being kept constant.

For example, FIG. 1 shows the switching state of the signals SLC10 . . . 50 and /SLC10 . . . 50. The input-side clock signal CLKIN, /CLKIN is coupled into the delay chain via the multiplexer 30. The signals /SLC30, SLC30 are thus in the state "01", so that the input connections 33, 34 are passed onto the output connections 37, 38 of the multiplexer 30. All of the upstream multiplexers are, for example, switched off, and their control signal combination is in the state "00". Alternatively, these multiplexers can also be set such that their second input is passed to their output. This is produced by the signal combination of the control signal "10". The multiplexers 40, 50 downstream from the multiplexer 30 have to assume this switch position in any case, and are thus driven by the signal combination "10" of the corresponding complementary bit pair of the control signal. Thus, accordingly, only one of the multiplexers has the control signal combination "01", while all the others have the control signal combination "10", "00" or "10" for the multiplexers upstream of the multiplexer to which the input signal is input.

Returning to the detailed circuit diagram shown in FIG. 2, only a single one of the multiplexers in the delay unit is thus set such that its third and its fourth current paths 312, 313 are active, by the corresponding bit SLC30 of the control signal being "1". This in each case applies only to that multiplexer to which the input signal CLKIN, /CLKIN is input. The corresponding third and fourth current paths of all the other multiplexers are switched off. Instead of this, the respective current flows through the first and the second current paths, comparable to the current paths 310, 311 in FIG. 2. It is thus desirable for the current paths 310, 311 to be as identical as possible in order to achieve as symmetrical a duty cycle as possible for the clock signal to be passed through them. In the example shown in FIG. 2, this relates to the passing on of the differential signal PRE, /PRE via the nodes 328, 329 to the output signals OUT, /OUT. In order to achieve this, the transistor surface areas of the transistors 316, 317 in the multiplexer 30, in particular the surface areas of their gate electrodes, are designed to be larger than the transistor surface areas of the transistors 320, 321, in particular the surface areas of their gate electrodes. As is known from the production of integrated circuits, commonality of transistor parameters of second transistors produced at the same time becomes better the larger the surface areas of these transistors. This is due to the fact that parasitic effects or dirt effects during production have less influence. If the transistor surface areas are larger, the parameters of the transistors 316, 317 are, better matched. The electrical conductivities of the paths 310, 311 are thus better matched to one another. The differential output signal OUT, /OUT thus has a very symmetrical duty cycle, that is to say the ratio of the low phases to the high phases of the clock signal is thus exactly 1:1.

In contrast, the transistors 320, 321 in the current paths 312, 313 may have a smaller surface area. Ideally, the surface area is chosen in the same way as that of the other transistors in the circuit, and is the minimum technologically practicable size. Since the current paths 312, 313 are active for only one of the multiplexers in the delay unit, but the current paths 310, 311 are active for all of the other multiplexers, a poorer matching probability between the transistors 320, 321 is, in the end, low with respect to the duty cycle of the output signal OUT, /OUT of the multiplexer, and thus also of the output signal CLKOUT, /CLKOUT of the overall delay unit. Thus only a minimum amount of more surface area is consumed for the integrated implementation, although the effect with respect to the improvement of the duty cycle can be detected to a considerably greater extent.

Figure 4:
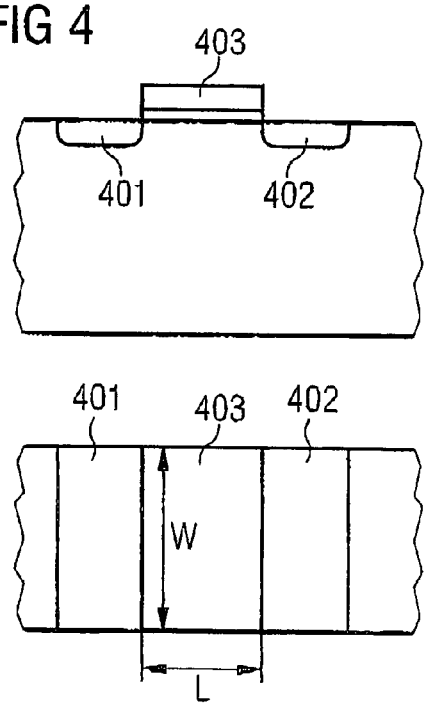
FIG. 4 shows a cross section through and a plan view of a field-effect transistor.

In the practical embodiment as illustrated in FIG. 4, the channel length L, which represents the effective distance between the drain and source doping regions 401, 402, is the same for all of the transistors. The width W of the gate 403 is the longitudinal extent of the gate running at right angles to this. This gate width W for the transistors 316, 317 is chosen to be larger, for example, 1.5 times larger, than the corresponding width W of the transistors 320, 321.

It should be noted that the input capacitance of the delay device, that is to say the capacitance which is applied to the connections 9, 11, and which must be supplied from a corresponding upstream driver (which is not illustrated) is not influenced by the measure of enlarging the transistors. The connections 9, 11 are connected to the transistors 320, 321. The transistors 316, 317 (which in fact have a higher gate-source capacitance than the transistors 320, 321) are not included in the input capacitance of the circuit.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

In the delay locked loop illustrated in FIG. 3, the clock signal CLK which is supplied to the input side is converted to a clock signal CLK' which can be tapped off on the output side and has a fixed, controlled phase shift with respect to the clock signal CLK. The central element of the delay locked loop is the delay path. The delay path comprises a first delay unit 2 and a second delay unit 1, which is connected downstream from it and is implemented as shown in FIG. 1. The first delay unit 2 prodices a short delay, and is used for fine setting of the overall delay time. The downstream delay unit 1 produces a greater delay, and is used for coarse setting of the overall delay time between the signals CLK", CLK-OUT.

A phase detector 4 determines the pahse difference between the clock signal CLK", which is supplied to the input side of the delay chain 2, 1 and the clock signal CLKOUT, which is tapped off on the output side there. If required, a circuit block with a fixed delay time 7 is connected in the feedback path. Depending on the phase difference, a control device 3 produces a control signal SLC, which provides one bit with complementary signal components for each of the multiplexers 10 . . . , 50 in the delay device 1. As explained in conjunction with FIG. 1, a maximum of only one bit is set during operation of the circuit such that one multiplexer passes on at its output the signal which was applied to its first input connection. All of the other multiplexers are set to precisely the complementary switching state. Apart from this, all the circuit blocks 5, 6, 7 have a constant delay time.

The phase locked loop in FIG. 3 has a very linear control range, dye to the use of the delay device illustrated in FIG. 1. The output signal is produced without jitter, to be precise independently of temperature, parameter fluctuations of the components resulting from tolerances in the production process, fluctuations in the supply voltage or the instantaneously set magnitude of the delay time. The delay locked loop in the illustrated architecture can cover a wide control range, up to very high clock frequencies, with the delay time nevertheless being set freely.

Overall, the delay device, which is formed from multiplexers, as illustrated representatively in FIG. 2, has better jitter since fluctuations in the supply voltage are blocked by the use of the capacitances 3222, 340, 330, 331. The jitter is also kept low by the current paths 312, 313 being decoupled from the current source 322 by the transistor 324 when the current paths 312, 313 are not active in any case. Furthermore, better matching of the transistors 316, 317, 320, 321 of the reference ground potential side of the current paths ensures a symmetrical duty cycle. In principle, it is sufficient to design at least one or a selection of multiplexers for the delay unit 1 illustrated in FIG. 1 as illustrated in FIG. 2. However, all of the multiplexers in the delay device 1 are expediently designed as illustrated in FIG. 2 and as described above.

LIST OF REFERENCE SYMBOLS

1 Delay device
2 Fine delay device
3 Control device
4 Phase detector
5, 6, 7 Circuit blocks
9, 11 Input connections
12, 13 Output connections
14 Control connection
10, 20, 30, 40, 50 Multiplexers
21, 41, 51 First input connections of multiplexers
22, 42, 52 Second input connections of multiplexers
23, 43, 54 Output connections of multiplexers
33, 34 First input connection of a multiplexer
35, 36 Second input connection of a multiplexer
37, 38 Output connection
31, 32 Control connection
60, 61 Signal profile
310, 311, 312, 313 Signal paths
314, . . . , 321 Transistors
324, . . . , 327 Transistors
322 Current source
3221 Gate connection
3222 Capacitor
323 Capacitor
324 Switching transistor
330, 331 Capacitors
332, 333 Circuit nodes
340 Capacitor
401, 402 Drain and source doping regions
403 gate
VDD supply voltage
VSS ground potential
SLC control signal
CLKIN input signal to be delayed
CLKOUT delayed output signal
PRE input signal
VN, VP reference potential
OUT output signal
W gate width
L gate length

What is claimed is:

1. An integratable, controllable delay device, comprising:
an input connection for an input signal to be delayed;
an output connection for a delayed output signal;
a control connection for a control signal, the control connection controlling the delay time and having two or more bits;
at least a first and a second multiplexer, each having a respective first and a respective second input connection and a respective output connection, the multiplexers being connected in series by the second connection of a third multiplexer being connected to the output of a second multiplexer and by the respective first connections of the multiplexers being coupled to the input connection, with a fifth multiplexer being coupled to the output connection, at least one of the at least first and second multiplexers having:
a first, a second, a third, and a fourth current paths, each path respectively including a first switch connected to one of the inputs of the respective multiplexer, and a respective second switch connected to a line of a control connection, which is associated with one bit of the control signals;
the current paths each being coupled to a resistance element, the first and the second current paths being connected to a current source, the third and the fourth current paths being connected via a resistance element to the current source, with
the resistance element and the second switches third and in the fourth current paths being controllable.
2. The delay device as claimed in claim 1, wherein the resistance element and the second switches in the third and fourth current paths are transistors whose control connections are coupled to one another.

3. The delay device as claimed in claim 1, wherein a coupling node of the first and of the second current paths and a connection of the controlled connection through the resistance element are connected to a connection for a reference ground potential via a drain/source path through a current source transistor.

4. The delay device as claimed in claim 3, wherein a control connection of the current source transistor is connected via a capacitor to the connection for the reference ground potential.

5. The delay device as claimed in claim 1, wherein the respective first switches in the first, second, third and fourth current paths are each a field-effect transistor with a respective channel width, wherein the first switches in the first and second current paths have the same channel width, and the first switches in the third and fourth current paths themselves have the same channel width, and wherein
the surface areas of the gate electrodes of the first switches in the first and second current paths are larger than the surface areas of the gate electrodes of the first transistors in the third and fourth current path.

6. The delay device as claimed in claim 5, wherein the channel width of the field-effect transistors, which form the first switches in the first and second current paths is larger than the channel width of the field-effect transistors, which form the first switches in the third and fourth current paths.

7. The delay device as claimed in claim 5, wherein the field-effect transistors each have the same channel length.

8. The delay device as claimed in claim 1, further comprising:
a first capacitor coupled between one of the output connections of the multiplexer and a connection for a supply potential, and a second capacitor coupled between another of the output connections of the multiplexer and the connection for the supply potential.

9. The delay device as claimed in claim 8, wherein the capacitors, which are connected to the output connections of the multiplexer, are p-channel field-effect transistors, whose drain and source connections are coupled to one another and are connected to the connection for the supply potential, and whose gate connections are connected to one of the output connections of the multiplexer.

10. The delay device as claimed in claim 1,
wherein the first and third current paths are connected to a first resistance element, and the second and fourth current paths are connected to a second resistance element,
wherein the resistance elements each have field-effect transistors whose gate connections are connected to a connection for a constant potential, and
wherein the connection for the constant potential is coupled via a capacitor to a connection for a supply potential.

11. The delay device as claimed in claim 10, wherein the capacitors, which couples the connection for a constant potential to the connection for a supply potentials, is a p-channel field-effect transistor, whose drain and source connections are coupled to one another and are connected to the connection for the supply potential, and whose gate connection is connected to the connection for the constant potential.

12. The delay device as claimed in claim 10, wherein the field-effect transistors in the resistance elements are p-channel field-effect transistors, whose drain/source paths are connected between the current paths and the connection for the supply potential.

13. The delay device as claimed in claim 1,
wherein the first and third current paths are connected to a first resistance element, and the second and the fourth current path are connected to a second resistance element
wherein the resistance elements each have field-effect transistors connected as diodes and via which the respective current paths are connected to the connection for the supply potential.

14. The delay device as claimed in claim 1, wherein the second switches in the first and in the second current paths are jointly connected to a signal line associated with one bit of the control signal, and the first switches in the first and second current paths are each connected to signal lines of the second connection of the multiplexer that carry complementary signals.

15. The delay device as claimed in claim 14, wherein the second switches in the third and fourth current paths are jointly connected to a signal line associated with a complementary bit of the control signal, and the first switches in the third and in the fourth current paths are each connected to signal lines of the first connection of the multiplexer that carry complementary signals.

16. The delay device as claimed in claim 1, wherein the second input of the multiplexer, which is arranged first in the series circuit, is connected to the reference potential, and the output of the multiplexer, which is arranged last in the series circuit is connected to the output connection.

17. The delay device as claimed in claim 1, wherein the control connection includes a large number of control bits, one complementary signal pair is supplied to one of the multiplexers in order to drive its switching state.

18. Use of an integratable, controllable delay device as claimed in claim 1, in a delay control loop, in which the delay time of the delay device is readjusted as a function of a phase difference between a clock signal which can be supplied to the delay device and a signal which can be tapped off on the output side.

19. An integratable multiplexer for use in a delay device comprising:
a first and a second input;
an output; a control connection;
a first, a second, a third, and a fourth current paths which each include a respective first switch connected to one of the inputs of the multiplexer, and one second switch connected to the control connection
the current paths each being coupled on the one hand to a resistance element the first and the second current paths being connected to a current source the third and the fourth current paths being connected via a further switch to the current source
respective control connections of the resistance element and of the second switches in the third and in the fourth current paths being connected to one another.

20. The integratable multiplexer as claimed in claim 19, wherein the resistance element and the second switches in the third and fourth current paths are in each case transistors whose control connections are coupled to one another.

21. The integratable multiplexer as claimed in claim 19, wherein a coupling node in the first and in the second current path and a connection of the control path of the resistance element are connected to a connection for a reference ground potential via a drain/source path through a current source transistor.

22. The integratable multiplexer as claimed in claim 21, wherein a control connection of the current source transistor is connected via a capacitor to the connection for the reference ground potential.

23. The integratable multiplexer as claimed in claim 19, wherein the first switches in the first, second, third, and fourth current paths, respectively, are field-effect transistors with a respective channel width, wherein the first switches in the first and second current paths have the same channel width, and the first switches in the third and fourth current paths have the same channel width, wherein the surface areas of the gate electrodes of the first switches in the first and second current paths are larger than the surface areas of the gate electrodes of the first transistors in the third and fourth current paths.

24. The integratable multiplexer as claimed in claim 23, wherein the channel width of the field-effect transistors which form the first switches in the first and in second current paths is larger than the channel width of the field-effect transistors which form the first switches in the third and fourth current path.

25. The integratable multiplexer as claimed in claim 23, wherein the field-effect transistors each have the same channel length.

26. The integratable multiplexer as claimed in claim 19, further comprising:

a first capacitor coupled between one of the output connections of the multiplexer and a connection for a supply potential, and a second capacitor coupled between another of the output connections of the multiplexer and the connection for the supply potential.

27. The integratable multiplexer as claimed in claim 26, wherein the capacitors connected to the output connections of the multiplexer are p-channel field-effect transistors, whose drain and source connections are coupled to one another and are connected to the connection for the supply potential, and whose gate connections are connected to one of the output connections of the multiplexer.

28. The integratable multiplexer as claimed in claim 19, wherein the first and third current paths are connected to a first resistance element the second and fourth current paths are connected to a second resistance element, wherein the resistance elements each have field-effect transistors whose gate connections are connected to a connection for a constant potential, and wherein the connection for the constant potential is coupled via a capacitor to a connection for a supply potential.

29. The integratable multiplexer as claimed in claim 28, wherein the capacitor, which couples the connection for a constant potential to the connection for a supply potential is a p-channel field-effect transistor, whose drain and source connections are coupled to one another and are connected to the connection for the supply potential, and whose gate connection is connected to the connection for the constant potential.

30. The integratable multiplexer as claimed in claim 28, wherein the field-effect transistors in the resistance elements are p-channel field-effect transistors, whose drain/source paths are connected between the current paths and the connection for the supply potential.

31. The device of claim 1, wherein there are five multiplexers, and the third multiplexer is downstream from the second multiplexer.

32. The device of claim 1, wherein the resistance element is a switch.

33. The integratable multiplexer as claimed in claim 19, wherein the resistance element is a switch.

34. The integratable multiplexer as claimed in claim 19, wherein the first and third current paths are connected to a first resistance element the second and fourth current paths are connected to a second resistance element, wherein the resistance elements each have field-effect transistors whose gate connections are connected to a connection for a constant potential, and wherein the connection for the constant potential is coupled via a capacitor to a connection for a supply potential.

35. The integratable, controllable delay device as claimed in claim 1, wherein at least one multiplexer, wherein the first and third current paths are connected to a first resistance element the second and fourth current paths are connected to a second resistance element, wherein the resistance elements each have field-effect transistors whose gate connections are connected to a connection for a constant potential, and wherein the connection for the constant potential is coupled via a capacitor to a connection for a supply potential.

* * * * *